United States Patent [19]

Ponkala

[11] 4,295,091
[45] Oct. 13, 1981

[54] CIRCUIT FOR MEASURING LOW CAPACITANCES

[75] Inventor: Jorma Ponkala, Helsinki, Finland

[73] Assignee: Vaisala Oy, Finland

[21] Appl. No.: 100,200

[22] Filed: Dec. 4, 1979

Related U.S. Application Data

[63] Continuation of Ser. No. 950,547, Oct. 12, 1978.

[51] Int. Cl.³ .................... G01R 27/26; G01R 19/26
[52] U.S. Cl. ................... 324/60 CD; 324/60 C; 324/61 R; 324/120; 340/870.37
[58] Field of Search ............ 324/60 CD, 60 C, 60 R, 324/61 R, 120; 340/870.37

[56] References Cited

U.S. PATENT DOCUMENTS 3,716,782  2/1973  Henry ..................... 324/60 CD

Primary Examiner—Ernest F. Karlsen
Attorney, Agent, or Firm—Steinberg & Raskin

[57] ABSTRACT

A capacitance to be measured is connected between the input and output of an inverting amplifier. A bistable circuit has an input connected to the output of the inverting amplifier and an output impedance inversely proportional to the capacitance to be measured. A resistive feedback is connected from the output of the bistable circuit to the input of the inverting amplifier.

6 Claims, 4 Drawing Figures

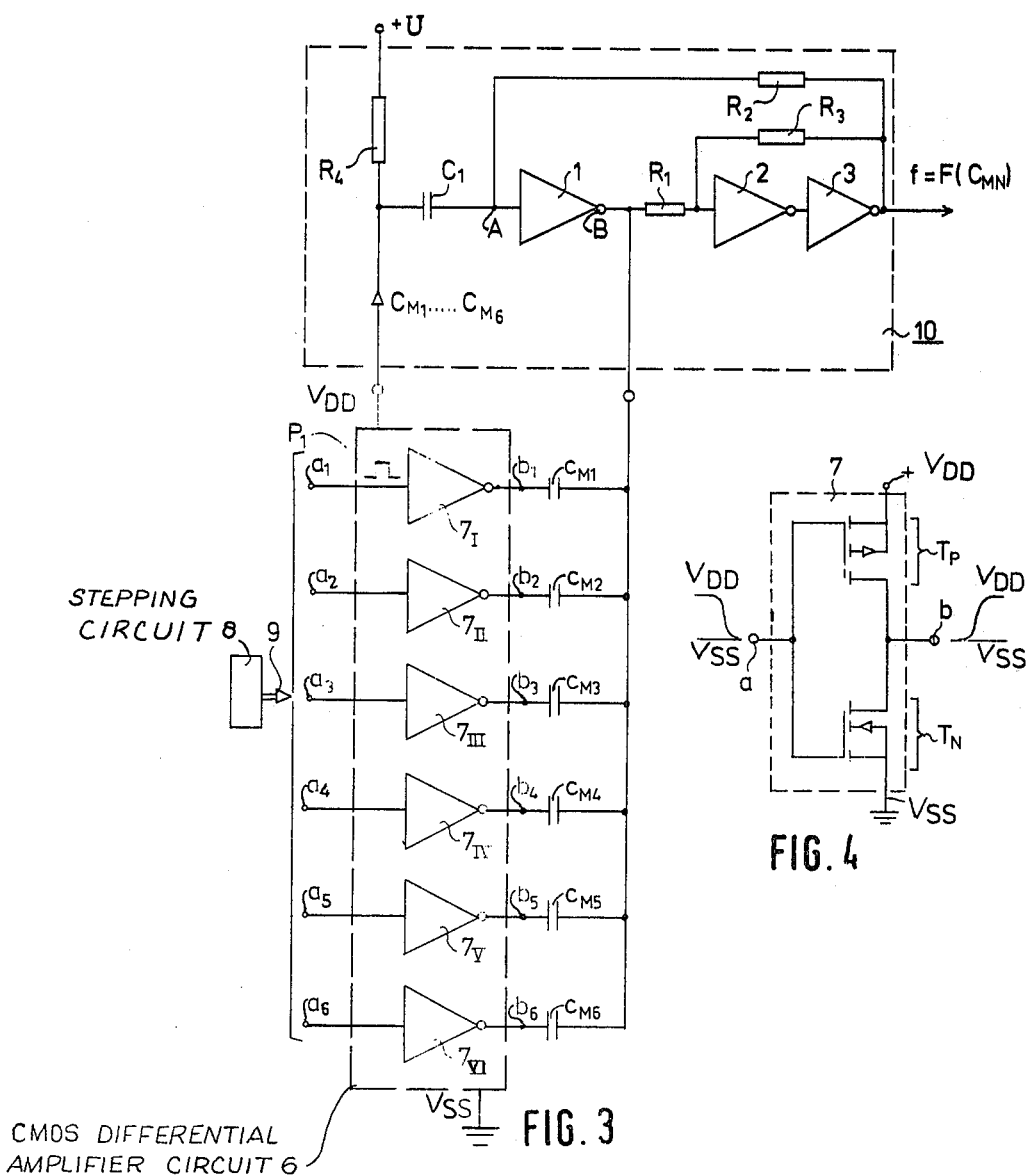

CIRCUIT FOR MEASURING LOW CAPACITANCES

This is a continuation, of application Ser. No. 950547, filed Oct. 12, 1978.

BACKGROUND OF THE INVENTION

The present invention relates to a circuit for measuring low capacitances. More particularly, the invention relates to a circuit for measuring low capacitances in which the influence of stray capacitances is eliminated. The circuit of the invention uses a bistable circuit, whose output frequency depends, preferably inversely proportionally, on the measured capacitance.

There have been difficulties in measuring low capacitances, particularly because, when using known methods, capacitances of the measuring wires and stray capacities, which may be in the same size order as the measured low capacities, have an influence on the result of the measurement.

SUMMARY OF THE INVENTION

The principal characteristic feature of the invention is that the capacitance to be measured is connected between a low-impedance generator and a circuit measuring only current, for example between the output and input of an inverting amplifier.

The circuit of the invention is particularly meant for telemetrical use, in which there are several measured capacities, which are connected one by one to the measuring circuit, by means of an electronic selector switch. In accordance with the invention, the electronic selector switch preferably comprises a CMOS inverting amplifier circuit, or the like, the outputs of each of various amplifiers of said circuit being connected to the capacitance to be measured, and the inputs of said amplifiers being connected to a stepping circuit. The measured signal is directed to the output of the measuring circuit from the voltage supply of the CMOS inverting amplifier circuit.

Accordingly, it is an object of this invention to provide a circuit in which the drawbacks of the known methods can be eliminated and low capacitances measured without any influence of stray capacities.

Another object of the invention is to provide a circuit in which small variations in the voltage applied to the measuring circuit have no influence on the accuracy of the measurement.

A further object of the invention is to provide a circuit suitable for telemetrical use such as, for example, in radiosondes.

Still another object of the invention is to provide a method that can be realized with simple and inexpensive equipment.

The foregoing and other objectives are attained by the circuit of the invention.

The invention accordingly comprises the features of construction, combinations of elements and arrangement of parts which will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 3 is a schematic diagram of a modification of the embodiment of FIG. 1, in which several measured capacitances are connected one by one to the measuring circuit via a special selector switch of the invention; and FIG. 4 is a circuit diagram of the basic structure of a CMOS inverting amplifier of FIG. 3.

DESCRIPTION OF PREFERRED EMBODIMENTS

Figure 1:
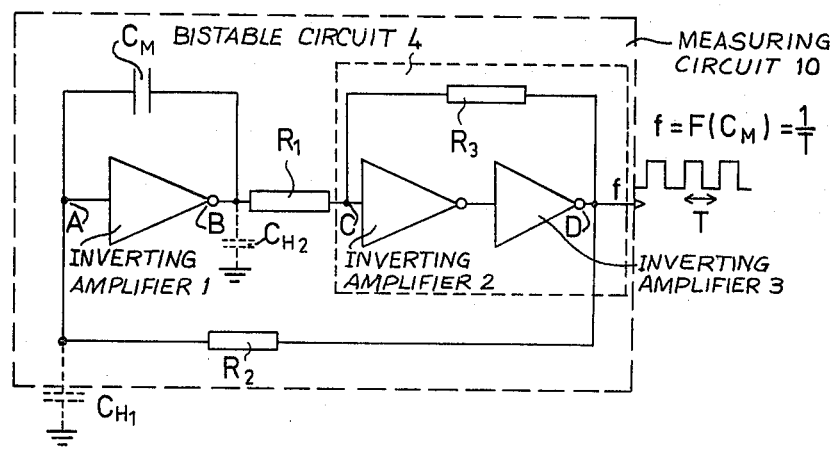
FIG. 1 is a schematic diagram of an embodiment of the circuit of the invention.
Figure 2:
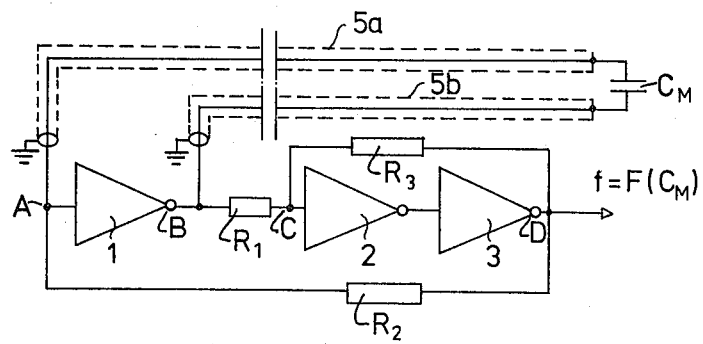
FIG. 2 is a schematic diagram of a modification of the embodiment of FIG. 1, in which the measured capacitance is remotely connected to the measuring circuit via coaxial cables.

As shown in FIGS. 1, 2 and 3, the measuring circuit 10 of the invention comprises an inverting amplifier 1 between points A and B. The inverting amplifier 1 is connected to the input C of a bistable circuit or bistable multivibrator circuit 4 via a resistor $R_1$. As shown in the Figs., the bistable circuit 4 comprises two inverting amplifiers 2 and 3. The output D of the bistable circuit 4 is fed back to its input C via a resistor $R_3$. The bistable circuit 4 may consist of a Schmitt trigger circuit, for example, which typically features two voltage levels and hysteresis between these levels.

A capacitance $C_M$ to be measured is connected between the output B and the input A of the inverting amplifier 1. A frequency $f = 1/T$ is provided at the output D of the bistable circuit 4. This frequency is the measuring unit for the measured capacitance $C_M$, so that the output frequency of the bistable circuit 4 is preferably inversely proportional to the measured capacitance $C_M$. An essential feature of the circuit of the invention is that the output D of the bistable circuit 4 is fed back resistively via a resistor $R_2$ to the input A of the inverting amplifier 1. It is important that the input A of the inverting amplifier 1 be sufficiently distinctively separated (low capacitance) from its output B. It is also important to have a sufficiently high resistive input impedance at the point A.

The aforedescribed circuitry functions as follows. Assume that, in the beginning, the point D is the positive side of the supply or input voltage. Current through the resistor $R_2$ then tends to raise the voltage at the point A. As the amplifier 1 is inverting, the rising tendency of the voltage at the point A tends to lower the voltage at the point B, and, via the measured capacitance $C_M$, to also lower the voltage at the point A. The result is that, in the ideal case, the voltage at the point A does not change at all. The measured capacitance $C_M$ is charged with constant current which is determined by the resistance $R_2$ and the voltage between the points D and A.

As the voltage at the point B is lowered to the lower triggering level of the bistable circuit 4, which may comprise a Schmitt trigger, the state of the bistable circuit changes and the voltage at the point D suddenly drops to the negative side of the supply voltage, from which moment the circuit continues to function as hereinbefore described. The current then flows in the opposite direction.

It is important to note in the foregoing description that the voltage at the point A did not change at all in any phase during the cycle. An important result of this fact is that stray capacitance $C_{H1}$, shown by broken lines in FIG. 1, and grounded at point A, has no influence on the output frequency f, because the voltage at the point A does not change, and consequently stray capacitance $C_{H1}$ is neither charged or discharged. The situation is the same if stray capacitance is connected to the point B, since the output frequency f does not change, due to the fact that in the ideal case, the inverting amplifier 1 is able to take or give a sufficiently high current to be able, in addition to its other functions, to charge and discharge such stray capacitance $C_{H2}$.

The foregoing description explains why, as shown in FIG. 2, the capacitance $C_M$ may be measured via a pair of coaxial cables 5a and 5b, for example, relatively far from the actual measuring circuit. In practice, this is an important advantage, since in radiosondes, for example, the measured capacitances are apart from each other and, in accordance with the invention, various capacitances can be connected, via coaxial cables, for example, to the aforedescribed measuring circuit without any loss of measuring accuracy. In previous methods or circuits for measuring low capacitances, this type of arrangement is completely impossible.

Another important advantage of the invention is that the capacitance being measured may be changed to other capacitances via a selector switch, which may be either a mechanical or electronic switch without any influence of stray capacitance on the measuring circuit. These other capacitances may be references, for example.

It may be assumed that a resistor $R_0$ represents the output impedance of the inverting amplifier 1. In real amplifiers, this impedance is always in excess of 0 ohms. A voltage acts at the point D of FIG. 1. The current flowing through the resistor $R_2$ tends to change the voltage level of the point A. However, this does not occur for the following reasons.

If the conditions are slightly idealized, it may be assumed that the gain of amplifier is infinite. In such case, the voltage at the output of the inverting amplifier changes in a direction opposite to that in which the current through the resistor $R_2$ tends to shift at the point A, with such high speed that the voltage at the point B changes at a speed making the current through the capacitor $C_M$ equal to the current flowing through said resistor, but of opposite polarity. Consequently, the voltage at the point A indeed does not change.

It is also due to this feedback through the capacitor $C_M$ that the stray capacitance $C_{H2}$ has no influence on the operation. More particularly, the voltage at the output of the inverting amplifier changes, as hereinbefore described, in such a manner that the current in the resistor $R_0$ is as high as is required to pass through the feedback capacitor to the point A plus, additionally, to charge or discharge the stray capacitance $C_{H2}$. The stray capacitance $C_{H2}$ does not begin to exert an influence on the frequency of oscillation until the case in which said stray capacitance increases to become so large that the output of the inverting amplifier 1 is unable to supply a current as high as the charging and discharging of said stray capacitance would require.

An assembly of the aforedescribed type, consisting of an inverting amplifier and a capacitor connected across its input and output is known as a Miller integrator. As its name implies, such a unit integrates a square wave, thereby providing a saw-tooth wave at the point B. Actually, of course, the stray capacitance $C_{H2}$ and the pick-up condensers connected across it have a slight effect on the frequency, because the amplifier does not have infinite gain. This is without significance in practice, however, if the gain is high enough.

FIGS. 3 and 4 show an electronic selector switch preferred for the aforedescribed use. As shown in FIG. 3, the selector switch comprises a CMOS inverting amplifier circuit 6 including six amplifier units $7_I$–$7_{VI}$. A unique and new feature of the electronic selector switch is that the amplifiers are connected "in the wrong way". More particularly, outputs $b_1$–$b_6$ of the various amplifiers $7_I$–$7_{VI}$, respectively, are connected to capacitances $C_{M1}$–$C_{M6}$, respectively, to be measured, and inputs $a_1$–$a_6$, respectively, are connected to a stepping circuit 8, known as such. The stepping circuit 8 provides a pulse P, through the path indicated by an arrow 9, alternately to each input terminal $a_1$–$a_6$ of the amplifier circuit 6.

FIG. 4 is a detailed example of the structure of a CMOS inverting amplifier in its simplest form. The CMOS inverting amplifier of FIG. 4 comprises two transistors $T_P$ and $T_N$, the transistor $T_P$ being a P channel MOS transistor and the transistor $T_N$ being an N channel MOS transistor. The resistance of the transistors $T_P$ and $T_N$ when conducting is in the order of 500 ohms and is several decades higher when said transistors are non-conducting. As shown in FIG. 3, there are six amplifiers 7 of the described type in the circuit 6, and the drain voltages $V_{DD}$ of these amplifiers are interconnected, as are their source voltages $V_{SS}$.

An essential feature of the aforedescribed selector switch is, first, as hereinbefore stated, that the amplifiers 7 are connected "in the wrong way" and that the measured signal is directed to the measuring circuit from the voltage supply of the CMOS circuit 6, for example, from its drain voltage $V_{DD}$. As shown in FIG. 3, this occurs so that a resistor $R_4$ applies a drive voltage +U to the selector switch, and said voltage is separated from the RC oscillator circuit via a capacitance $C_1$, in accordance with the invention. The resistor $R_4$ is preferably in the order of 150 kilohms, and the capacitance $C_1$ is preferably in the order of 10 nF. The capacitance $C_1$ must, of course, be high enough to keep its influence on the frequency being measured insignificant. The value of approximately 10 nF for the capacitance $C_1$ is suitable, if measured capacitances $C_M$ are in the order of from a few pF's to a few tens of pF's. A typical operational feature of the aforedescribed electronic selector switch is that, as one of the capacitances $C_{M1}$–$C_{M6}$ is connected to the measuring circuit, as shown in FIG. 3, the other capacitances are grounded.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A circuit for measuring low capacitances with the elimination of the influence of stray capacitances, said circuit comprising an inverting amplifier having an input and an output;
a capacitance to be measured connected between the input and the output of the inverting amplifier;

a bistable circuit having an input connected to the output of said inverting amplifier, an output and an output frequency inversely proportional to the capacitance to be measured; and a resistive feedback connected from the output of the bistable circuit to the input of the inverting amplifier.

2. A circuit as claimed in claim 1, wherein the input of said amplifier functions as a low impedance generator having a low internal resistance and the output of said amplifier functions as a circuit measuring only current.

3. A circuit as claimed in claim 1, wherein bistable circuit comprises a bistable multivibrator.

4. A circuit as claimed in claim 1, wherein said bistable circuit comprises a Schmitt trigger.

5. A circuit as claimed in claim 1, wherein the capacitance to be measured is located remotely from said inverting amplifier and said bistable circuit and further comprising a pair of coaxial cables connecting said capacitance to be measured to the input and output of said inverting amplifier.

6. A circuit as claimed in claim 5, wherein said capacitance to be measured has a pair of spaced terminals and each of said coaxial cables has an inner conductor and an outer conductor, the outer conductor of each of said cables being connected to ground, the inner conductor of one of said cables connecting one of the terminals of said capacitance to be measured to the input of said inverting amplifier and the inner conductor of the other of said cables connecting the other of the terminals of said capacitance to be measured to the output of said inverting amplifier.

* * * * *

REEXAMINATION CERTIFICATE (2651st)
United States Patent [19]
Ponkala

[11] B1 4,295,091
[45] Certificate Issued  Aug. 15, 1995

[54] CIRCUIT FOR MEASURING LOW CAPACITANCES

[75] Inventor: Jorma Ponkala, Helsinki, Finland

[73] Assignee: Vaisaka Oy, Finland

Reexamination Request:
No. 90/003,209, Oct. 1, 1993

Reexamination Certificate for:
Patent No.: 4,295,091
Issued: Oct. 13, 1981
Appl. No.: 100,200
Filed: Dec. 4, 1979

Related U.S. Application Data

[63] Continuation of Ser. No. 950,547, Oct. 12, 1978, abandoned.

[51] Int. Cl.⁶ .................................. G01R 27/26
[52] U.S. Cl. .................... 324/611; 324/120; 324/681; 324/684; 324/688; 340/870.37
[58] Field of Search ............ 324/678, 611, 681, 120, 324/679, 684, 607, 609, 688; 340/870.37; 331/111, 143, 135; 73/304 C; 177/210 C, 210 FP

[56] References Cited

U.S. PATENT DOCUMENTS

| | | | |
|---|---|---|---|
| 2,188,628 | 1/1940 | Freystedt | 73/304 C |
| 2,431,841 | 12/1947 | Storm | 324/611 |
| 2,937,369 | 5/1960 | Newbold et al. | 324/609 |
| 3,301,056 | 1/1967 | Blanchard et al. | 73/304 C |
| 3,379,976 | 4/1968 | Niedereder | 331/143 |
| 3,534,606 | 10/1970 | Stamler et al. | 73/304 C |
| 3,584,297 | 6/1971 | Koski | 324/611 |
| 3,978,424 | 8/1976 | Hobo et al. | 331/143 |
| 4,011,500 | 3/1977 | Pelletier et al. | 324/678 |
| 4,083,248 | 4/1978 | Maier | 73/304 C |
| 4,187,460 | 2/1980 | Dauge et al. | 324/678 |

OTHER PUBLICATIONS

Kanno et al.; "Stray-Effect-Free Direct . . . " CPEM Digest 1978; Conference on Precision Electromagnetic Measurements; Ottawa, Canada; 26–29 Jun. 1978; pp. 86–88.

Tsao, "Apparatus for Accurate DC Capacitance-Resistance Transfer, IEEE Transactions on Instrumentation and Measuremant", vol. IM–23, No. 4, Dec. 1974, pp. 310–314.

Graeme, "Applications of Operational Amplifiers: Third Generation Techniques," McGraw Hill Book Company, 1973, pp. 144–207.

Bjerede, "On A Class of Capacitively Tuned Transducer Oscillators," IEEE Transactions on Instrumentation and Measurement, vol. IM–18, No. 4, Dec. 1969, pp. 336–340.

*Primary Examiner*—Ernest F. Karlsen

[57] ABSTRACT

A capacitance to be measured is connected between the input and output of an inverting amplifier. A bistable circuit has an input connected to the output of the inverting amplifier and an output impedance inversely proportional to the capacitance to be measured. A resistive feedback is connected from the output of the bistable circuit to the input of the inverting amplifier.

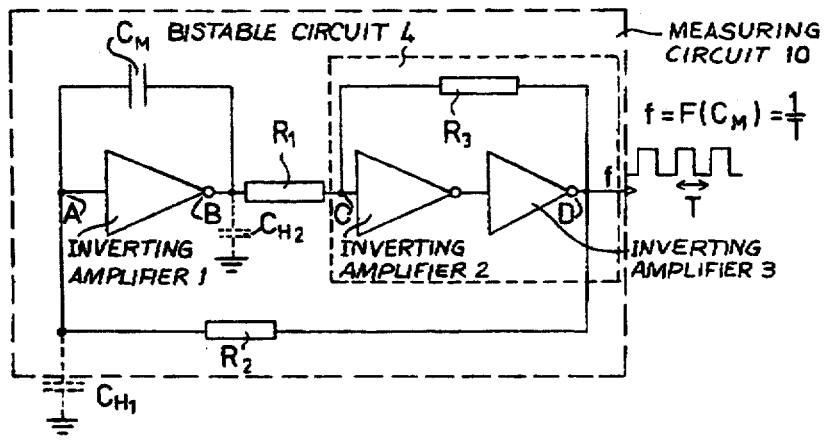

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-6 are cancelled.

* * * * *